(12) United States Patent
Blanchard

(10) Patent No.: US 7,586,148 B2
(45) Date of Patent: Sep. 8, 2009

(54) POWER SEMICONDUCTOR DEVICE HAVING A VOLTAGE SUSTAINING REGION THAT INCLUDES DOPED COLUMNS FORMED BY TERRACED TRENCHES

(75) Inventor: Richard A. Blanchard, Los Altos, CA (US)

(73) Assignee: General Semiconductor, Inc., Melville, NY (US)

(*) Notice: Subject to any disclaimer, the term of this patent is extended or adjusted under 35 U.S.C. 154(b) by 0 days.

(21) Appl. No.: 11/496,233

(22) Filed: Jul. 31, 2006

(65) Prior Publication Data
US 2006/0267083 A1    Nov. 30, 2006

Related U.S. Application Data

(62) Division of application No. 10/770,045, filed on Feb. 2, 2004, now Pat. No. 7,084,455, which is a division of application No. 10/103,674, filed on Mar. 21, 2002, now Pat. No. 6,686,244.

(51) Int. Cl.
*H01L 29/78* (2006.01)

(52) U.S. Cl. .............. 257/328; 257/339; 257/E26.418; 257/E29.257

(58) Field of Classification Search .......... 257/328, 257/E21.418, E29.257, 339, 342, E26.418; 438/212, 268
See application file for complete search history.

(56) References Cited

U.S. PATENT DOCUMENTS 4,140,558 A    2/1979  Murphy et al. .............. 148/175

(Continued)

FOREIGN PATENT DOCUMENTS

DE    19843959 B4    4/2000
JP    2002-353447    12/2002

OTHER PUBLICATIONS

Cezac, N., "A New Generation of Power Unipolar Devices: the Concept of the Floating Islands MOS Transistor," Proceedings of the 12th International Symposium on Power Semiconductor Devices and ICs, May 2000, pp. 69-72.

(Continued)

*Primary Examiner*—Anh D Mai
(74) *Attorney, Agent, or Firm*—Mayer & Williams PC; Karin L. Williams, Esq.; Stuart H. Mayer, Esq.

(57) ABSTRACT

A method is provided for forming a power semiconductor device. The method begins by providing a substrate of a first conductivity type and forming a voltage sustaining region on the substrate. The voltage sustaining region is formed in the following manner. First, an epitaxial layer is deposited on the substrate. The epitaxial layer has a first or a second conductivity type. Next, at least one terraced trench is formed in the epitaxial layer. The terraced trench has a trench bottom and a plurality of portions that differ in width to define at least one annular ledge therebetween. A barrier material is deposited along the walls and bottom of the trench. A dopant of a conductivity type opposite to the conductivity type of the epitaxial layer is implanted through the barrier material lining the annular ledge and at the trench bottom and into adjacent portions of the epitaxial layer to respectively form at least one annular doped region and another doped region. The dopant is diffused in the annular doped region and the another doped region to cause the regions to overlap one another, whereby a continuous doped column is formed in the epitaxial layer. A filler material is deposited in the terraced trench to substantially fill the terraced trench. Finally, at least one region of conductivity type opposite to the conductivity type of the epitaxial layer is formed over the voltage sustaining region to define a junction therebetween.

11 Claims, 7 Drawing Sheets

STEP

13. ION IMPLANTATION
14. DIFFUSION
15. FILL TRENCH
16. PLANARIZE THE WAFER

U.S. PATENT DOCUMENTS

| | | | |
|---|---|---|---|
| 4,419,150 A | 12/1983 | Soclof | 148/187 |
| 4,569,701 A | 2/1986 | Oh | 148/188 |
| 4,593,302 A | 6/1986 | Lidow et al. | 357/23.4 |
| H204 H | 2/1987 | Oh et al. | 438/433 |
| 4,711,017 A | 12/1987 | Lammert | 437/20 |
| 4,719,185 A | 1/1988 | Goth | 257/525 |
| 4,754,310 A | 6/1988 | Coe | 257/287 |
| 4,893,160 A | 1/1990 | Blanchard | 257/334 |
| 4,914,058 A | 4/1990 | Blanchard | 438/270 |
| 4,929,563 A | 5/1990 | Tsunoda et al. | 257/173 |
| 5,108,783 A | 4/1992 | Tanigawa et al. | 437/63 |
| 5,216,275 A | 6/1993 | Chen | 257/493 |
| 5,488,236 A | 1/1996 | Baliga et al. | 257/132 |
| 5,831,288 A | 11/1998 | Singh et al. | 257/330 |
| 5,981,332 A | 11/1999 | Mandelman et al. | 438/246 |
| 6,097,076 A | 8/2000 | Gonzalez et al. | 257/510 |
| 6,194,741 B1 | 2/2001 | Kinzer et al. | 257/329 |
| 6,319,777 B1 | 11/2001 | Hueting et al. | 438/270 |
| 6,362,505 B1 * | 3/2002 | Tihanyi | 257/329 |
| 6,376,878 B1 | 4/2002 | Kocon | 257/328 |
| 6,380,569 B1 | 4/2002 | Chang et al. | 257/256 |
| 6,465,304 B1 | 10/2002 | Blanchard | 438/268 |
| 6,468,847 B1 | 10/2002 | Disney | 438/197 |
| 6,475,864 B1 | 11/2002 | Sato et al. | 438/268 |
| 6,476,429 B2 | 11/2002 | Baba | 257/273 |
| 6,509,220 B2 | 1/2003 | Disney | 438/197 |
| 6,509,240 B2 | 1/2003 | Ren et al. | 438/302 |
| 6,566,201 B1 | 5/2003 | Blanchard | 438/268 |
| 6,576,516 B1 | 6/2003 | Blanchard | 438/268 |
| 6,624,494 B2 | 9/2003 | Blanchard et al. | 257/493 |
| 6,639,272 B2 | 10/2003 | Ahlers et al. | 257/328 |
| 6,649,459 B2 | 11/2003 | Deboy et al. | 438/173 |
| 6,649,477 B2 | 11/2003 | Blanchard et al. | 438/268 |
| 6,656,797 B2 | 12/2003 | Blanchard | 438/268 |
| 6,686,244 B2 | 2/2004 | Blanchard | 438/268 |
| 6,710,400 B2 | 3/2004 | Blanchard | 257/328 |
| 6,750,104 B2 | 6/2004 | Blanchard et al. | 438/268 |
| 6,919,610 B2 * | 7/2005 | Saitoh et al. | 257/492 |
| 2001/0026977 A1 | 10/2001 | Hattori et al. | 438/268 |
| 2001/0036704 A1 | 11/2001 | Hueting et al. | 438/270 |
| 2001/0041400 A1 | 11/2001 | Ren et al. | 438/200 |
| 2001/0046739 A1 | 11/2001 | Miyasaka et al. | 438/268 |
| 2001/0046753 A1 | 11/2001 | Gonzalez et al. | 438/424 |
| 2001/0053568 A1 | 12/2001 | Deboy et al. | 438/138 |
| 2001/0055861 A1 | 12/2001 | Patti et al. | |
| 2002/0008258 A1 | 1/2002 | Baba | 257/273 |
| 2002/0070418 A1 * | 6/2002 | Kinzer et al. | 257/496 |
| 2002/0117715 A1 | 8/2002 | Opperman et al. | 257/339 |
| 2002/0123195 A1 | 9/2002 | Frisina et al. | 438/268 |
| 2002/0132405 A1 | 9/2002 | Disney | 438/268 |
| 2002/0135014 A1 | 9/2002 | Ahlers et al. | 438/268 |

OTHER PUBLICATIONS

Chen, X. et al., "A Novel High-Voltage Sustaining Structure With Buried Oppositely Doped Regions," IEEE Transactions on Electron Devices, vol. 47, No. 6, Jun. 2000, pp. 1280-1285.

Deboy, G. et al., "A New Generation of High Voltage MOSFETs Breaks The Limit Line Of Silicon," Proceedings of the IEDM, No. 26.2.1, Dec. 6-9, 1998, pp. 683-685.

Ming-Kwang Lee et al., "On the Semi-Insulating Polycrystalline Silicon Resistor," *Solid State Electronics*, vol. 27, No. 11, 1984, pp. 995-1001.

Wolf, Stanley, *Silicon Processing for the VLSI Era*, vol. 1, *Process Technology*, © 1986, 9 pp.

* cited by examiner

THE DOPANT DISTRIBUTION OF A HIGH VOLTAGE VERTICAL
DMOS TRANSISTOR WITH A RELATIVELY LOW ON-RESISTANCE

STEP

1. EPITAXIAL DEPOSITION
2. FORM BARRIER LAYER
3. MASK AND ETCH THE TRENCH BARRIER LAYER
4. TRENCH ETCH

STEP

5. FORM A LAYER OF MATERIAL ON THE INSIDE OF TRENCH
6. ETCH LAYER FROM TRENCH BOTTOM

STEP

7. ETCH TRENCH

8. FORM A LAYER OF MATERIAL ON THE INSIDE OF THE TRENCH

STEP

9. REPEAT THE STEPS OF ETCHING THE MATERIAL FROM THE BOTTOM OF THE TRENCH, ETCHING THE SILICON TO INCREASE THE DEPTH OF THE TRENCH, AND FORMING ADDITIONAL MATERIAL ON THE SIDEWALLS AND THE BOTTOM OF THE TRENCH FOR ALL BUT THE LAST LAYER OF ISLANDS

STEP

10. ETCH LAYER FROM TRENCH BOTTOM AND ETCH TRENCH

11. REMOVE ALL MATERIAL FROM TRENCH SIDEWALL

12. GROW OXIDE LAYER

STEP

13. ION IMPLANTATION

14. DIFFUSION

15. FILL TRENCH

16. PLANARIZE THE WAFER

US 7,586,148 B2

POWER SEMICONDUCTOR DEVICE HAVING A VOLTAGE SUSTAINING REGION THAT INCLUDES DOPED COLUMNS FORMED BY TERRACED TRENCHES

STATEMENT OF RELATED APPLICATIONS

This application is a divisional of U.S. patent application Ser. No. 10/770,045, now U.S. Pat. No. 7,085,455, entitled "Power Semiconductor Device Having a Voltage Sustaining Region That Includes Doped Columns Formed With a Single Ion Implantation Step," filed in the United States Patent and Trademark Office on Feb. 2, 2004, which is a divisional of U.S. patent application Ser. No. 10/103,674, filed Mar. 21, 2002, now U.S. Pat. No. 6,686,244. Both of these prior applications are incorporated by reference herein in their entireties.

This application is related to U.S. patent application Ser. No. 09/970,972 entitled "Method for Fabricating a Power Semiconductor Device Having a Floating Island Voltage Sustaining Layer," filed in the United States Patent and Trademark Office on Oct. 4, 2001, now U.S. Pat. No. 6,465,304, which is incorporated herein by reference in its entirety.

This application is related to U.S. patent application Ser. No. 10/039,068 entitled "Method For Fabricating A High Voltage Power MOSFET Having A Voltage Sustaining Region That Includes Doped Columns Formed By Rapid Diffusion," filed in the United States Patent and Trademark Office on Dec. 31, 2001, now U.S. Pat. No. 6,566,201, which is incorporated herein by reference in its entirety.

This application is related to U.S. patent application Ser. No. 10/038,845 entitled "Method For Fabricating A High Voltage Power MOSFET Having A Voltage Sustaining Region That Includes Doped Columns Formed By Trench Etching and Ion Implantation," filed in the United States Patent and Trademark Office on Dec. 31, 2001, now U.S. Pat. No. 6,656,797, which is incorporated herein by reference in its entirety.

This application is related to U.S. patent application Ser. No. 09/970,758 entitled "Method For Fabricating A Power Semiconductor Device Having A Voltage Sustaining Layer with a Terraced Trench Facilitating Formation of Floating Islands," filed in the United States Patent and Trademark Office on Oct. 4, 2001, now U.S. Pat. No. 6,649,477, which is incorporated herein by reference in its entirety.

FIELD OF THE INVENTION

The present invention relates generally to semiconductor devices, and more particularly to power MOSFET devices.

BACKGROUND OF THE INVENTION

Power MOSFET devices are employed in applications such as automobile electrical systems, power supplies, and power management applications. Such devices should sustain high voltage in the off-state while having a low voltage drop and high current flow in the on-state.

FIG. 1 illustrates a typical structure for an N-channel power MOSFET. An N-epitaxial silicon layer 1 formed over an N+ silicon substrate 2 contains p-body regions 5a and 6a, and N+ source regions 8 and 9 for two MOSFET cells in the device. P-body regions 5 and 6 may also include deep p-body regions 5b and 6b. A source-body electrode 12 extends across certain surface portions of epitaxial layer 1 to contact the source and body regions. The N-type drain for both cells is formed by the portion of N-epitaxial layer 1 extending to the upper semiconductor surface in FIG. 1. A drain electrode is provided at the bottom of N+ substrate 2. An insulated gate electrode 18 typically of polysilicon lies primarily over the portions of the drain at the surface of the device between the body regions, and separated from the body and drain by a thin layer of dielectric, often silicon dioxide. A channel is formed between the source and drain at the surface of the body region when the appropriate positive voltage is applied to the gate with respect to the source and body electrode.

The on-resistance of the conventional high voltage MOSFET shown in FIG. 1 is determined largely by the drift zone resistance in epitaxial layer 1. The drift zone resistance is in turn determined by the doping and the layer thickness of epitaxial layer 1. However, to increase the breakdown voltage of the device, the doping concentration of epitaxial layer 1 must be reduced while the layer thickness is increased. Curve 20 in FIG. 2 shows the on-resistance per unit area as a function of the breakdown voltage for a conventional MOSFET. Unfortunately, as curve 20 shows, the on-resistance of the device increases rapidly as its breakdown voltage increases. This rapid increase in resistance presents a problem when the MOSFET is to be operated at higher voltages, particularly at voltages greater than a few hundred volts.

FIG. 3 shows a MOSFET that is designed to operate at higher voltages with a reduced on-resistance. This MOSFET is disclosed in paper No. 26.2 in the Proceedings of the IEDM, 1998, p. 683. This MOSFET is similar to the conventional MOSFET shown in FIG. 2 except that it includes p-type doped regions 40 and 42 which extend from beneath the body regions 5 and 6 into the drift region of the device. The p-type doped regions 40 and 42 define columns in the drift region that are separated by n-type doped columns, which are defined by the portions of the epitaxial layer 1 adjacent the p-doped regions 40 and 42. The alternating columns of opposite doping type cause the reverse voltage to be built up not only in the vertical direction, as in a conventional MOSFET, but in the horizontal direction as well. As a result, this device can achieve the same reverse voltage as in the conventional device with a reduced layer thickness of epitaxial layer 1 and with increased doping concentration in the drift zone. Curve 25 in FIG. 2 shows the on-resistance per unit area as a function of the breakdown voltage of the MOSFET shown in FIG. 3. Clearly, at higher operating voltages, the on-resistance of this device is substantially reduced relative to the device shown in FIG. 1, essentially increasing linearly with the breakdown voltage.

The improved operating characteristics of the device shown in FIG. 3 are based on charge compensation in the drift region of the transistor. That is, the doping in the drift region is substantially increased, e.g., by an order of magnitude or more, and the additional charge is counterbalanced by the addition of columns of opposite doping type. The blocking voltage of the transistor thus remains unaltered. The charge compensating columns do not contribute to the current conduction when the device is in its on state. These desirable properties of the transistor depend critically on the degree of charge compensation that is achieved between adjacent columns of opposite doping type. Unfortunately, nonuniformities in the dopant gradient of the columns can be difficult to avoid as a result of limitations in the control of process parameters during their fabrication. For example, diffusion across the interface between the columns and the substrate and the interface between the columns and the p-body region will give rise to changes in the dopant concentration of the portions of the columns near those interfaces.

The structure shown in FIG. 3 can be fabricated with a process sequence that includes multiple epitaxial deposition steps, each followed by the introduction of the appropriate dopant. Unfortunately, epitaxial deposition steps are expensive to perform and thus this structure is expensive to manufacture. Another technique for fabricating these devices is shown in U.S. application Ser. No. 09/970,972, now U.S. Pat. No. 6,465,304, in which a trench is successively etched to different depths. A dopant material is implanted and diffused through the bottom of the trench after each etching step to form a series of doped regions (so-called "floating islands") that collectively function like the p-type doped regions 40 and 42 seen in FIG. 3. However, the on-resistance of a device that uses the floating island technique is not as low as an identical device that uses continuous columns.

Accordingly, it would be desirable to provide a method of fabricating the MOSFET structure shown in FIG. 3 that requires a minimum number of epitaxial deposition steps so that it can be produced less expensively while also allowing sufficient control of process parameters so that a high degree of charge compensation can be achieved in adjacent columns of opposite doping type in the drift region of the device.

SUMMARY OF THE INVENTION

In accordance with the present invention, a method is provided for forming a power semiconductor device. The method begins by providing a substrate of a first conductivity type and forming a voltage sustaining region on the substrate. The voltage sustaining region is formed in the following manner. First, an epitaxial layer is deposited on the substrate. The epitaxial layer has a first or a second conductivity type. Next, at least one terraced trench is formed in the epitaxial layer. The terraced trench has a trench bottom and a plurality of portions that differ in width to define at least one annular ledge therebetween. A barrier material is deposited along the walls and bottom of the trench. A dopant of a conductivity type opposite to the conductivity type of the epitaxial layer is implanted through the barrier material lining the annular ledge and at the trench bottom and into adjacent portions of the epitaxial layer to respectively form at least one annular doped region and another doped region. The dopant is diffused in the annular doped region and the another doped region to cause the regions to overlap one another, whereby a continuous doped column is formed in the epitaxial layer. A filler material is deposited in the terraced trench to substantially fill the terraced trench. Finally, at least one region of conductivity type opposite to the conductivity type of the epitaxial layer is formed over the voltage sustaining region to define a junction therebetween.

In accordance with another aspect of the invention, the step of forming the terraced trench includes the steps of successively etching the plurality of portions of the terraced trench beginning with a largest width portion and ending with a smallest width portion. The smallest width portion may be located at a depth in the epitaxial layer such that it is closer to the substrate than the largest width portion.

In accordance with yet another aspect of the invention, the plurality of portions of the terraced trench are coaxially located with respect to one another.

Power semiconductor devices that may be formed by the present invention include, for example, a vertical DMOS, a V-groove DMOS, and a trench DMOS MOSFET, an IGBT, and a bipolar transistor.

DETAILED DESCRIPTION

In accordance with the present invention, a method of forming the p-type columns in the voltage sustaining layer of a semiconductor power device may be generally described as follows. First, a terraced trench is formed in the epitaxial layer that is to form the voltage sustaining region of the device. The terraced trench is formed from two or more co-axially located trenches that are etched at different depths in the epitaxial layer. The diameter of each individual trench is greater than the diameter of the trenches located at greater depths in the epitaxial layer. Adjacent trenches meet in horizontal planes to define annular ledges, which arise from the differential in the diameter of the adjacent trenches. P-type dopant material is implanted into both the annular ledges and the bottom of the deepest trench in a single implantation step. The implanted material is diffused into the portion of the voltage sustaining region located immediately adjacent to and below the ledges and trench bottom. The implanted material thus forms a series of doped sections that are configured as coaxially-located annular rings. A thermal diffusion step is performed to cause adjacent doped sections to overlap one another, thus forming a continuous doped column of the type depicted in FIG. 3. Finally, the terraced trench is filled with a material that does not adversely affect the characteristics of the device. Exemplary materials that may be used for the material filling the trench include highly resistive polysilicon, a dielectric such as silicon dioxide, or other materials and combinations of materials.

Figure 4:
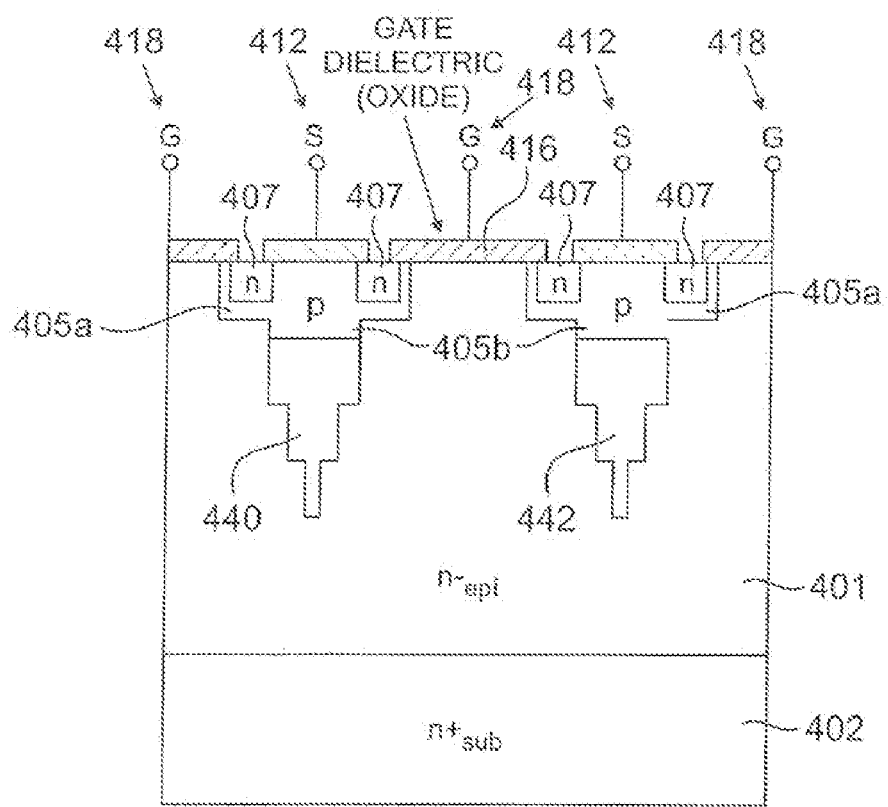
FIG. 4 shows a MOSFET structure constructed in accordance with the present invention.

FIG. 4 shows a power semiconductor device constructed in accordance with the present invention. An N-type epitaxial silicon layer 401 formed over an N+ silicon substrate 402 contains P-body regions 405, and N+ source regions 407 for two MOSFET cells in the device. As shown, P-body regions 405a may also include deep P-body regions 405b. A source-body electrode 412 extends across certain surface portions of epitaxial layer 401 to contact the source and body regions. The N-type drain for both cells is formed by the portion of N-epitaxial layer 401 extending to the upper semiconductor surface. A drain electrode is provided at the bottom of N+ substrate 402. An insulated gate electrode 418 comprising oxide and polysilicon layers lies over the channel and drain portions of the body. P-type doped columns 440 and 442 extend from beneath the body regions 405 into the drift region of the device. The p-type doped regions 440 and 442 define columns in the drift region that are separated by n-type doped columns, which are defined by the portions of the epitaxial layer 401 adjacent the p-doped columns 440 and 442. As previously mentioned, by using alternating columns of opposite doping type this device can achieve the same reverse voltage as in a conventional device with a reduced layer thickness of epitaxial layer 401 and with increased doping concentration in the drift zone.

The power semiconductor device of the present invention may be fabricated in accordance with the following exemplary steps, which are illustrated in FIGS. 5(a)-5(f).

First, the N-type doped epitaxial layer 501 is grown on a conventionally N+ doped substrate 502. Epitaxial layer 1 is typically 15-50 microns in thickness for a 400-800 V device with a resistivity of 5-40 ohm-cm. Next, a dielectric masking layer is formed by covering the surface of epitaxial layer 501 with a dielectric layer, which is then conventionally exposed and patterned to leave a mask portion that defines the location of the trench $520_1$. The trench $520_1$ is dry etched through the mask openings by reactive ion etching to an initial depth that may range from 5-15 microns. In particular, if "x" is the number of equally spaced, vertically arranged, doped sections that are desired, the trench 520 should be initially etched to a depth of approximately $1/(x+1)$ of the thickness of the portion of epitaxial layer 502 that is between the subsequently-formed bottom of the body region and the top of the N+ doped substrate. The sidewalls of each trench may be smoothed, if needed. First, a dry chemical etch may be used to remove a thin layer of oxide (typically about 500-1000 Ⓓ) from the trench sidewalls to eliminate damage caused by the reactive ion etching process. Next, a sacrificial silicon dioxide layer is grown over the trench $520_1$. The sacrificial layer is removed either by a buffer oxide etch or an HF etch so that the resulting trench sidewalls are as smooth as possible.

Figure 5A:
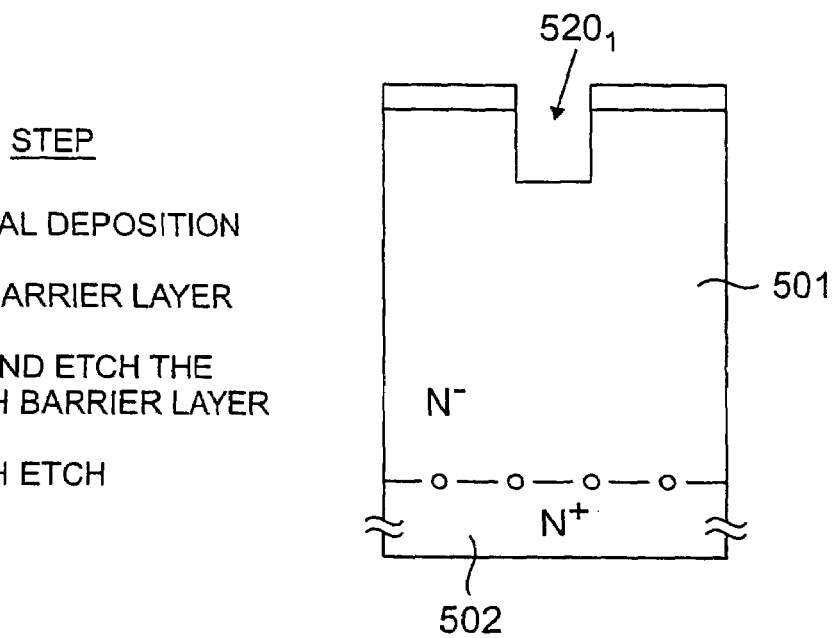
FIGS. 5(a)-5(f) show a sequence of exemplary process steps that may be employed to fabricate a voltage sustaining region constructed in accordance with the present invention.
Figure 5B:
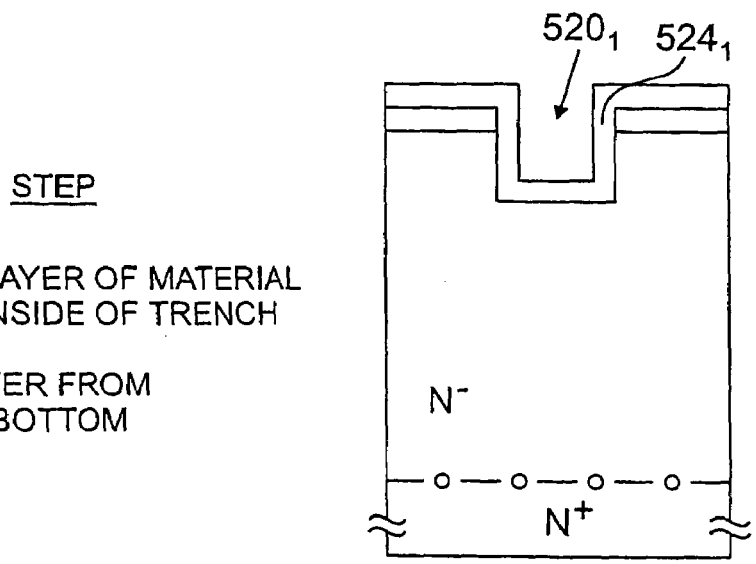

In FIG. 5(b), a layer of silicon dioxide $524_1$ is grown in trench $520_1$. The thickness of the silicon dioxide layer $524_1$ will determine the differential in diameter (and hence the radial width of the resulting annular ledge) between trench $520_1$ and the trench that is to be subsequently formed. Oxide layer $524_1$ is removed from the bottom of the trench $520_1$.

Figure 5C:
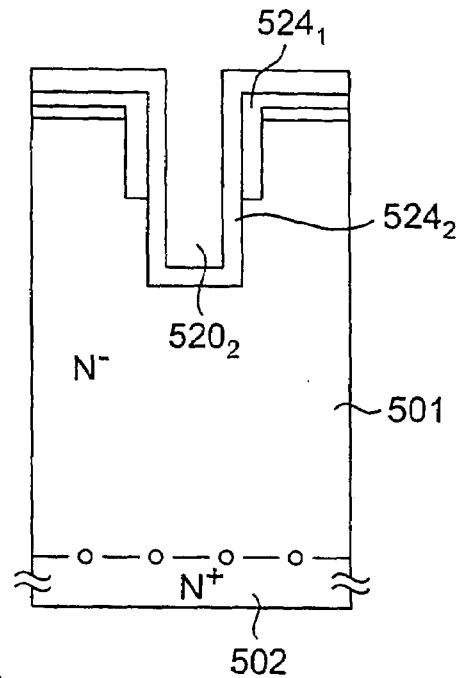

In FIG. 5(c), a second trench $520_2$ is etched through the exposed bottom of the trench $520_1$. In this embodiment of the invention the thickness of trench $520_2$ is the same as the thickness of trench $520_1$. That is, trench $520_2$ is etched by an amount approximately equal to $1/(x+1)$ of the thickness of the portion of epitaxial layer 501 that is located between the bottom of the body region and the N+-doped substrate. Accordingly, the bottom of trench $520_2$ is located at a depth of $2/(x+1)$ below the bottom of the body region.

Figure 5D:
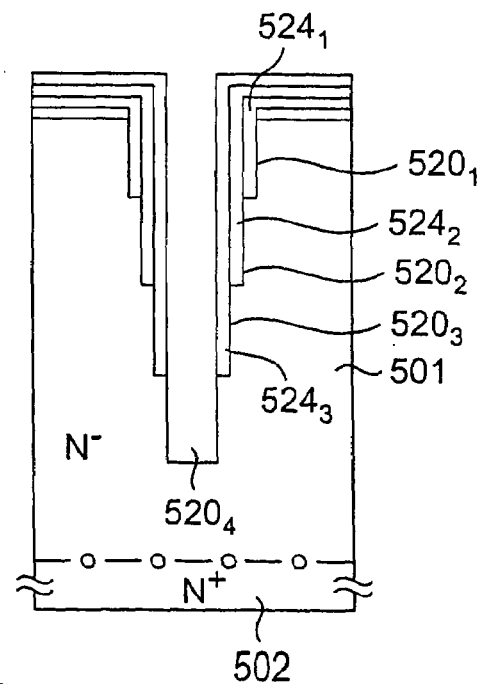

Next, in FIG. 5(d), a third trench $520_3$ may be formed by first growing an oxide layer $524_2$ on the walls of trench $520_2$. Once again, the thickness of the silicon dioxide layer $524_2$ will determine the differential in diameter (and hence the radial width of the resulting annular ledge) between trench $520_2$ and trench $520_3$. Oxide layer $524_2$ is removed from the bottom of the trench $520_3$. This process can be repeated as many times as necessary to form the desired number of trenches, which in turn dictates the number of doped sections that are created to form each doped column seen in FIG. 3. For example, in FIG. 5(d), four trenches $520_1$-$520_4$ are formed.

Figure 5E:
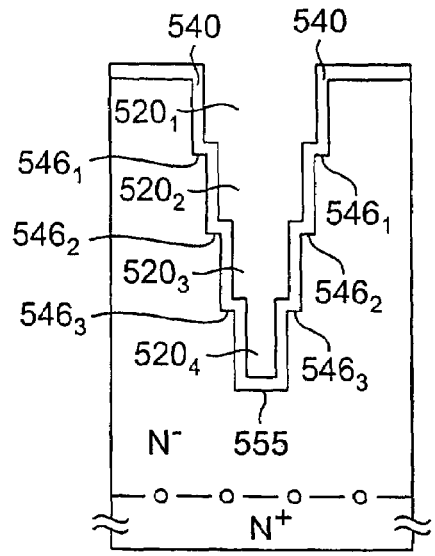

In FIG. 5(e), the various layers of oxide material located on the sidewalls of the trenches $520_1$-$520_4$ are removed by etching to define annular ledges $546_1$-$546_3$. Next, an oxide layer 540 of substantially uniform thickness is grown in the trenches $520_1$-$520_4$. The thickness of oxide layer 540 should be sufficient to prevent implanted atoms from penetrating through the sidewalls of the trenches into the adjacent silicon, while allowing the implanted atoms to penetrate through the portion of oxide layer 540 located on the ledges $546_1$-$546_3$ and the trench bottom 555.

The diameter of trenches $520_1$-$520_4$ should be selected so that the resulting annular ledges $546_1$-$546_3$ and the trench bottom all have the same surface area. In this way, when a dopant is introduced into the ledges and trench bottom, each resulting doped section will have the same total charge. Alternatively, the distance between the ledges may be varied so that the same average charge is present from the top to the bottom of the trench.

Figure 1:
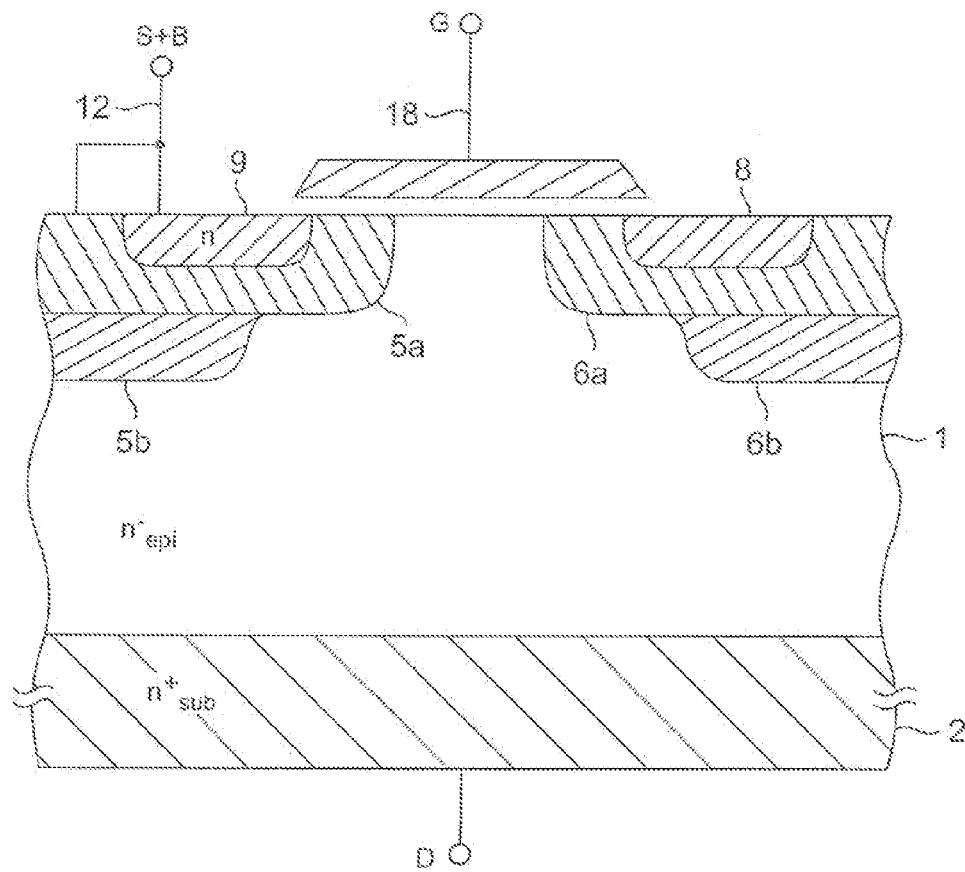
FIG. 1 shows a cross-sectional view of a conventional power MOSFET structure.
Figure 2:
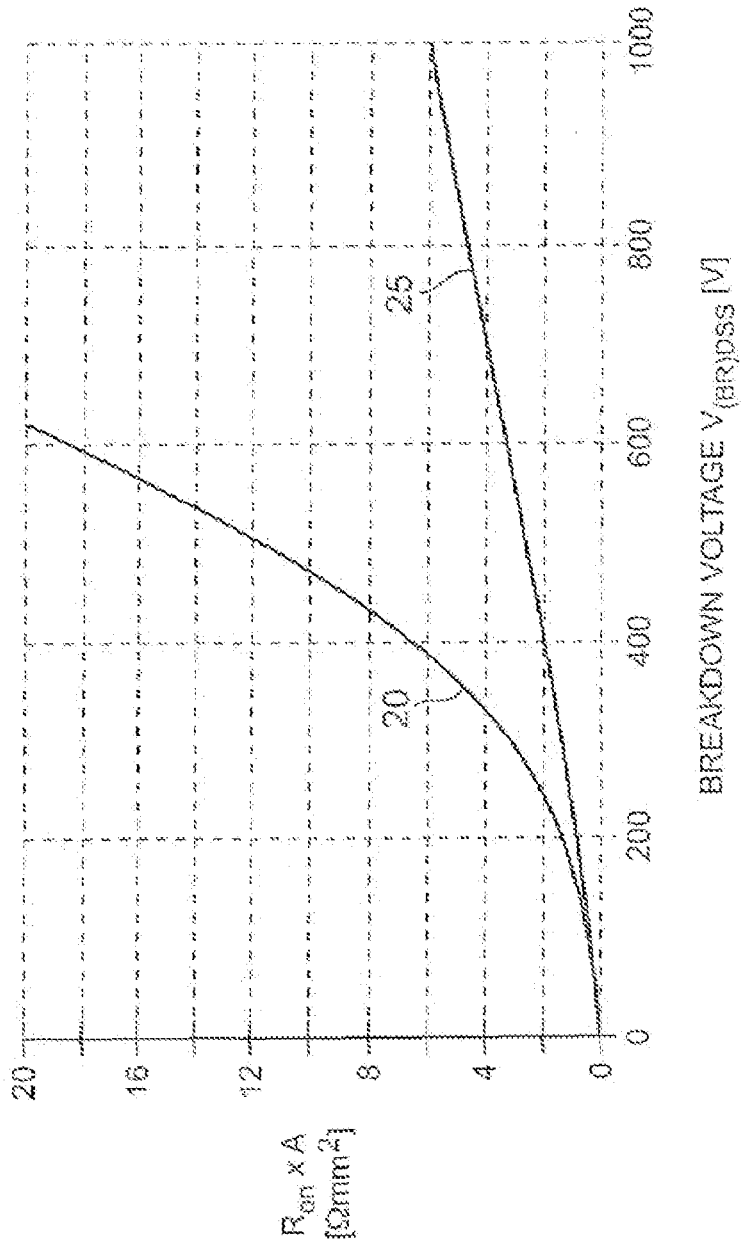
FIG. 2 shows the on-resistance per unit area as a function of the breakdown voltage for a conventional power MOSFET.
Figure 3:
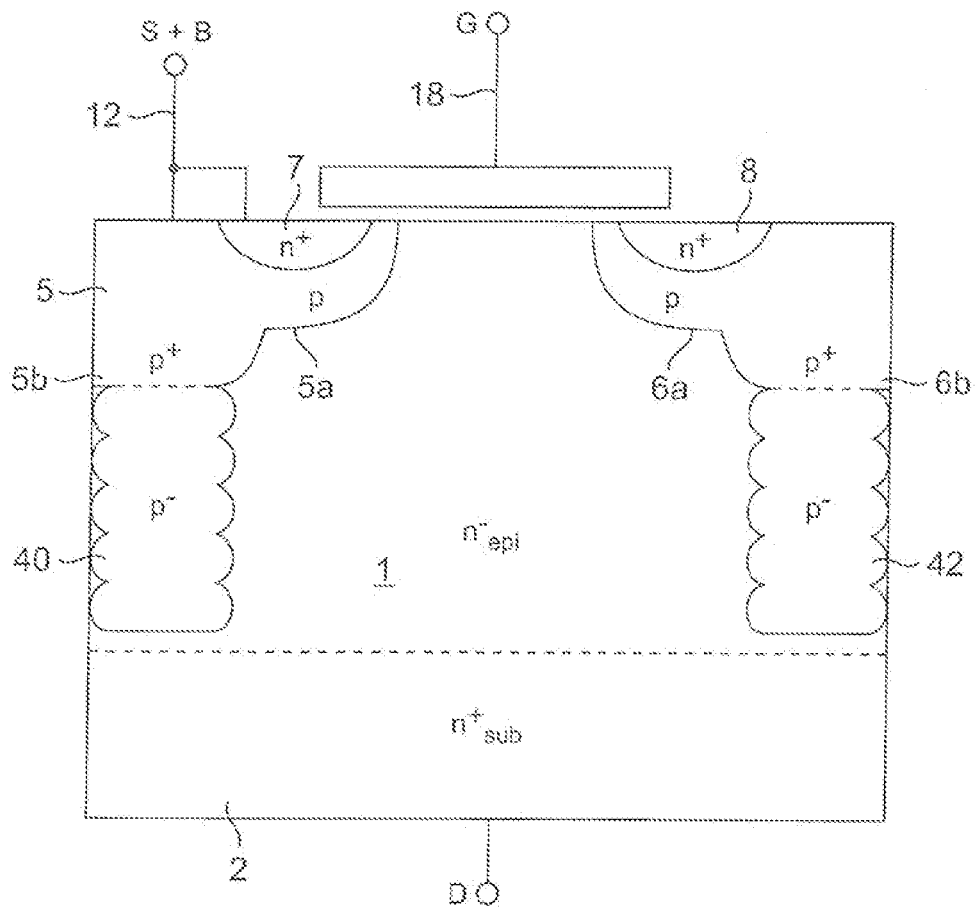
FIG. 3 shows a MOSFET structure that includes a voltage sustaining region with columns of p-type dopant located below the body region, which is designed to operate with a lower on-resistance per unit area at the same voltage than the structure depicted in FIG. 1.
Figure 5F:
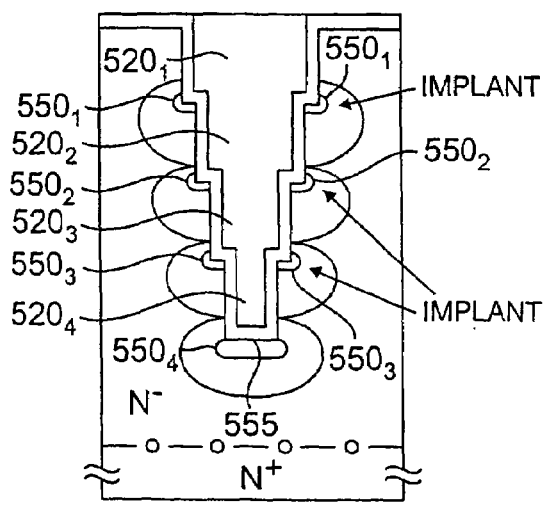

Next, in FIG. 5(f), a dopant such as boron is implanted through the portion of oxide layer 540 located on the ledges $546_1$-$546_3$ and the trench bottom 555. The total dose of dopant and the implant energy should be chosen such that the amount of dopant left in the epitaxial layer 501 after the subsequent diffusion step is performed satisfies the breakdown requirements of the resulting device. A high temperature diffusion step is performed to "drive-in" the implanted dopant both vertically and laterally to create doped sections $550_1$-$550_4$. In particular, the diffusion step is performed to cause adjacent ones of the doped sections $550_1$-$550_4$ to overlap one another, thus forming a continuous doped column of the type indicated in FIG. 5(f), which is depicted in FIG. 3.

The terraced trench, which is composed of individual trenches $520_1$-$520_4$, is next filled with a material that does not adversely affect the characteristics of the device. Exemplary materials include, but are not limited to, thermally grown silicon dioxide, a deposited dielectric such as silicon dioxide, silicon nitride, or a combination of thermally grown and deposited layers of these or other materials. Finally, the surface of the structure is planarized as shown in FIG. 5(f).

The aforementioned sequence of processing steps resulting in the structure depicted in FIG. 5(f) provides a voltage sustaining layer with one or more doped columns on which any of a number of different power semiconductor devices can be fabricated. As previously mentioned, such power semiconductor devices include vertical DMOS, V-groove DMOS, and trench DMOS MOSFETs, IGBTs and other MOS-gated devices as well as diodes and bipolar transistors. For instance, FIG. 4 shows an example of a MOSFET that may be formed on the voltage sustaining region of FIG. 5. It should be noted that while FIG. 5 shows a single terraced trench, the present invention encompasses a voltage sustaining regions having single or multiple terraced trenches to form any number of doped columns.

Once the voltage sustaining region has been formed as shown in FIG. 5, the MOSFET shown in FIG. 4 can be completed in the following manner. The gate dielectric (oxide) 416 is grown after an active region mask is formed. Next, a layer of polycrystalline silicon is deposited, doped, and oxidized. The polysilicon layer is then masked to form the gate regions 418. The p+ doped deep body regions 405b are formed using conventional masking, implantation and diffusion steps. For example, the p+-doped deep body regions are boron implanted at 20 to 200 KeV with a dosage from about $1 \times 10^{14}$ to $5 \times 10^{15}/cm^2$. The shallow body region 405a is formed in a similar fashion. The implant dose for this region will be $1 \times 10^{13}$ to $5 \times 10^{14}/cm^2$ at an energy of 20 to 100 KeV.

Next, a photoresist masking process is used to form a patterned masking layer that defines source regions 407. Source regions 407 are then formed by an implantation and diffusion process. For example, the source regions may be implanted with arsenic at 20 to 100 KeV to a concentration that is typically in the range of $2 \times 10^{15}$ to $1.2 \times 10^{16}/cm^2$. After implantation, the arsenic is diffused to a depth of approximately 0.5 to 2.0 microns. The depth of the body region typically ranges from about 1-3 microns, with the P+ doped deep body region (if present) being slightly deeper. The DMOS transistor is completed in a conventional manner by etching the oxide layer to form contact openings on the front surface. A metallization layer is also deposited and masked to define the source-body and gate electrodes. Also, a pad mask is used to define pad contacts. Finally, a drain contact layer is formed on the bottom surface of the substrate.

It should be noted that while a specific process sequence for fabricating the power MOSFET is disclosed, other process sequences may be used while remaining within the scope of this invention. For instance, the deep p+ doped body region may be formed before the gate region is defined. It is also possible to form the deep p+ doped body region prior to forming the trenches. In some DMOS structures, the P+ doped deep body region may be shallower than the P-doped body region, or in some cases, there may not even be a P+ doped deep body region.

Although various embodiments are specifically illustrated and described herein, it will be appreciated that modifications and variations of the present invention are covered by the above teachings and are within the purview of the appended claims without departing from the spirit and intended scope of the invention. For example, a power semiconductor device in accordance with the present invention may be provided in which the conductivities of the various semiconductor regions are reversed from those described herein. Moreover, while a vertical DMOS transistor has been used to illustrate exemplary steps required to fabricate a device in accordance with the present invention, other DMOS FETs and other power semiconductor devices such as diodes, bipolar transistors, power JFETs, IGBTs, MCTs, and other MOS-gated power devices may also be fabricated following these teachings.

What is claimed is:

1. A power semiconductor device comprising:
    a substrate of a first conductivity type;
    a voltage sustaining region disposed on said substrate, said voltage sustaining region including:
    an epitaxial layer having a first or second conductivity type;
    at least one terraced trench located in said epitaxial layer, said terraced trench having a trench bottom and a plurality of terrace portions that differ in width to define a plurality of annular ledges therebetween;
    at least one doped column having a dopant of a conductivity type opposite to the conductivity type of the epitaxial layer, said doped column being formed from at least one annular doped region and another doped region diffused into one another, said at least one annular doped region and said another doped region being located in said epitaxial layer adjacent to and below said plurality of annular ledges and said trench bottom, respectively, wherein the trench bottom and the plurality of terrace portions each have a same total charge;
    a filler material substantially filling said terraced trench; and
    at least one active region of a conductivity opposite to the conductivity type of the epitaxial layer disposed over said voltage sustaining region to define a junction therebetween,
        wherein said epitaxial layer has a given thickness and wherein said plurality of annular ledges are separated by a space substantially equal to 1/(x+1) of said given thickness, where x is equal to or greater than a number of said plurality of annular ledges formed in the voltage sustaining region.

2. The device of claim 1 wherein said filler material is silicon dioxide.

3. The device of claim 1 wherein said filler material is silicon nitride.

4. A power semiconductor device comprising:
    a substrate of a first conductivity type;
    a voltage sustaining region disposed on said substrate, said voltage sustaining region including:
    an epitaxial layer having a first or second conductivity type;
    at least one terraced trench located in said epitaxial layer, said terraced trench having a trench bottom and a plurality of terrace portions that differ in width to define at least one annular ledge therebetween;
    at least one doped column having a dopant of a conductivity type opposite to the conductivity type of the epitaxial layer, said doped column being formed from at least one annular doped region and another doped region diffused into one another, said at least one annular doped region and said another doped region being located in said epitaxial layer adjacent to and below said at least one annular ledge and said trench bottom, respectively, wherein the trench bottom and plurality of terrace portions each have a same total charge;
    a filler material substantially filling said terraced trench; and
    at least one active region of a conductivity opposite to the conductivity type of the epitaxial layer disposed over said voltage sustaining region to define a junction therebetween,
    wherein said plurality of portions of the terraced trench includes a smallest width portion and a largest width portion, said smallest width portion being located at a depth in said epitaxial layer such that it is closer to the substrate than a largest width portion,
        wherein said plurality of portions of the terraced trench are coaxially located with respect to one another,
        wherein said plurality of portions of the terraced trench includes at least three portions that differ in width from one another to define at least two annular ledges and said at least one annular doped region includes at least two annular doped regions, and
        wherein a surface area of the at least two annular ledges are substantially equal to one another.

5. The device of claim 4 wherein said plurality of portions of the terraced trench includes at least three portions that differ in width from one another to define at least two annular ledges and said at least one annular doped region includes at least two annular doped regions.

6. The device of claim 4 wherein said material tilling the trench is a dielectric material.

7. The device of claim 4 wherein said dopant is boron.

8. The device of claim 4 wherein said at least one active region further includes:
    a gate dielectric and a gate conductor disposed above said gate dielectric;
    first and second body regions located in the epitaxial layer to define a drift region therebetween, said body regions having a second conductivity type; and
    first and second source regions of the first conductivity type located in the first and second body regions, respectively.

9. The device of claim 8 wherein said body regions include deep body regions.

10. The device of claim 4 wherein said terraced trench has a circular cross-section.

11. The device of claim 4 wherein said terraced trench has a cross-sectional shape selected from the group consisting of a square, rectangle, octagon, and a hexagon.

* * * * *

UNITED STATES PATENT AND TRADEMARK OFFICE
CERTIFICATE OF CORRECTION

PATENT NO. : 7,586,148 B2
APPLICATION NO. : 11/496233
DATED : September 8, 2009
INVENTOR(S) : Blanchard Page 1 of 1

It is certified that error appears in the above-identified patent and that said Letters Patent is hereby corrected as shown below:

Claim 6, Col. 8, line 45, after "material", change "tilling" to -- filling --.

Signed and Sealed this

Twenty-ninth Day of December, 2009

David J. Kappos
*Director of the United States Patent and Trademark Office*